United States Patent [19]
Imazeki et al.

[11] 4,451,902
[45] May 29, 1984

[54] POWER SOURCE DEVICE FOR BUBBLE MEMORY UNIT

[75] Inventors: Ryoji Imazeki; Masayuki Hattori, both of Hachioji; Shigeo Nakamura, Hino, all of Japan

[73] Assignee: Fanuc Ltd., Tokyo, Japan

[21] Appl. No.: 282,268

[22] Filed: Jul. 10, 1981

[30] Foreign Application Priority Data

Jul. 14, 1980 [JP] Japan .................................. 55-95975

[51] Int. Cl.³ ...................... G11C 19/08; H02M 3/335
[52] U.S. Cl. .......................................... 365/1; 363/21
[58] Field of Search ................ 365/1; 363/21, 37, 69, 363/70

[56] References Cited

U.S. PATENT DOCUMENTS

| | | | |
|---|---|---|---|
| 3,873,846 | 3/1975 | Morio et al. | 363/21 |
| 4,172,277 | 10/1979 | Pinson | 363/21 |
| 4,236,196 | 11/1980 | Koizumi et al. | 363/21 |
| 4,253,136 | 2/1981 | Nanko | 363/21 |
| 4,327,422 | 4/1982 | Imazeki et al. | 365/1 |
| 4,330,816 | 5/1982 | Imazeki et al. | 363/21 |

*Primary Examiner*—James W. Moffitt
*Attorney, Agent, or Firm*—Staas & Halsey

[57] ABSTRACT

In a power source device for a bubble memory unit consisting of a bubble memory part and a control part, a controlling supply voltage to be applied to both the bubble memory part and the control part is produced by a power source circuit based on a pulse width modulation system. The power source circuit is provided with a circuit which can expand the signal pulse width in excess of its upper-limit value during the ordinary voltage control. When the controlling supply voltage has become lower than a predetermined value, the pulse width is expanded so that the refresh operation may be perfectly executed when the power source device for the bubble memory unit is turned off.

8 Claims, 9 Drawing Figures

POWER SOURCE DEVICE FOR BUBBLE MEMORY UNIT

BACKGROUND OF THE INVENTION

This invention relates to a power source device for an electronic apparatus such as an electronic computer. More particularly, it relates to a power source device which has a plurality of supply voltage or signal output terminals and which is suitable for a bubble memory unit in an electronic apparatus such as electronic computer.

A bubble memory unit is a so-called nonvolatile memory unit whose stored content is held even after the disconnection of the power supply. Therefore, bubble memory units have heretofore been used in electronic computers and have recently come into use in the data memory devices of numerical control systems. A bubble memory unit includes a bubble memory part in which information is stored, and a control part which controls the writing and reading of information into and from the bubble memory part, etc. The bubble memory part and the control part are connected with a power source device which is prepared for the bubble memory unit. The power source device delivers a memory enable signal (signal $M_e$) which establishes conditions for permitting the control part to transmit read and write instructions to the bubble memory part, a controlling supply voltage (supply voltage $E_c$) which is applied to both the bubble memory part and the control part, and a driving supply voltage (supply voltage $E_d$) which serves to drive the bubble memory part.

The power source device is commonly turned "on" or "off" in one of two ways: (1) the commercial power supply is kept applied and the output of the power source device is turned "on" or "off" by a power switch disposed within the power source device, and (2) no power switch is disposed and the closure or opening of a commercial power supply is relied on. In either case, the signal $M_e$ and the supply voltages $E_c$ and $E_c$ must be applied or cut off in a predetermined sequence. More specifically, when the bubble memory unit is energized, the supply voltage $E_c$, the supply voltage $E_d$ and the signal $M_e$ must be applied in the order mentioned, and when the bubble memory unit is deenergized, they must be cut off in the reverse order. Especially in the case of deenergizing the bubble memory unit, that period of time after the cutoff of the signal $M_e$ in which the supply voltage $E_d$ falls to a predetermined value needs to be at least several milliseconds, and besides, the supply voltage $E_c$ must hold a predetermined value during the period. If a period of time on the order of several milliseconds cannot be obtained, the refresh operation in which information being read is rewritten into the bubble memory part will not be perfectly executed and the stored information will be lost. In this regard, a prior-art power source device is not guaranteed to make the period of time several milliseconds or longer without fail. Therefore, the prior art prevents the disappearance of information by, for example, installing a backing-up power source separately. For this reason, the prior-art power source device for the bubble memory unit has the disadvantages of being large in size and being high in production cost.

SUMMARY OF THE INVENTION

It is accordingly an object of this invention to provide a power source device with a plurality of supply voltage or signal output terminals when which, in energizing or deenergizing the power source device, the outputs can be turned "on" or "off" in a prescribed sequence and at predetermined time intervals.

Another object of this invention is to provide a power source device for a bubble memory unit in which, especially when the outputs of the power source device are turned "off", the period of time in which a supply voltage $E_c$ applied to a bubble memory part falls to its service lower-limit value after a signal $M_e$ applied to a control part has turned "off" can be held for at least several milliseconds.

Still another object of this invention is to provide a power source device in which, even when a commercial power supply applied to the power source device is unexpectedly interrupted, the refresh operation for a bubble memory part is completely carried out.

BRIEF DESCRIPTION OF THE DRAWINGS

The present invention will be more clearly understood by referring to the following detailed description when considered in conjunction with the accompanying drawings wherein.

DETAILED DESCRIPTION

Figure 1:
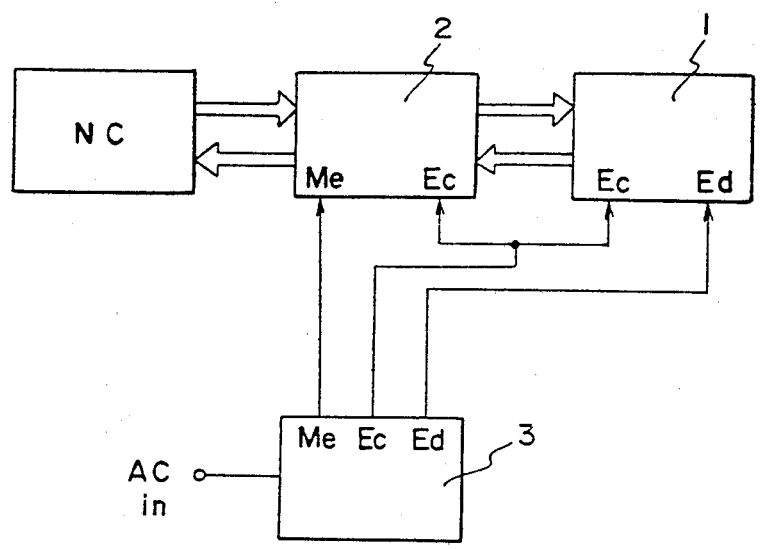
FIG. 1 is a block diagram of a general bubble memory unit provided with a power source device.

FIG. 1 is a block diagram of a bubble memory unit provided with a power source device. Referring to the figure, numeral 1 designates a bubble memory part, and numeral 2 a control part which controls the writing and reading of information into and from the bubble memory part 1, etc. The control part 2 also exchanges information with a numerical control system NC. A power source device 3 feeds supply voltages and a signal to the bubble memory part 1 and the control part 2 which constitute the bubble memory unit. That is, the power source device 3 delivers the supply voltages $E_c$ and $E_d$ and the signal $M_e$. The supply voltage $E_c$ serves to control the bubble memory part 1 and the control part 2, while the supply voltage $E_d$ serves to drive the bubble memory part 1. The signal $M_e$ is a signal which establishes condition for permitting the control part 2 to transmit the instruction for reading or writing information to the bubble memory part 1, and it is a kind of enable signal.

Figure 2:
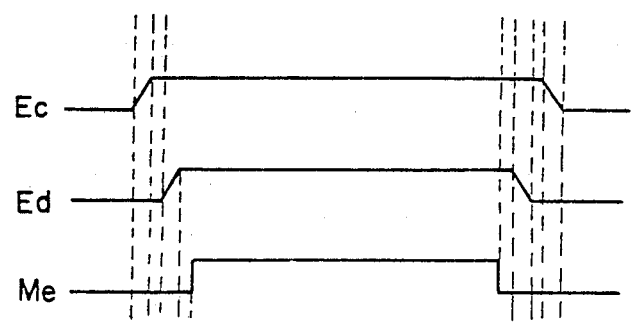
FIG. 2 is a waveform diagram of supply voltages and a signal which are applied to predetermined parts of the bubble memory unit.

FIG. 2 shows the waveforms of the outputs of the power source device 3 in the case where the bubble memory unit, consisting of the bubble memory part 1 and the control part 2, is energized and in the case where it is deenergized. In either case, the supply voltage $E_c$, supply voltage $E_d$ and signal $M_e$ must be applied from the power source device 3 or cut off in the sequence illustrated in FIG. 2. Especially in the case of deenergizing the power source device 3, that period of time after the cutoff of the signal $M_e$ in which the supply voltage $E_c$ applied to the bubble memory part 1 falls to the minimum voltage value required can be made at least several milliseconds without fail in accordance with this invention.

Figure 3:
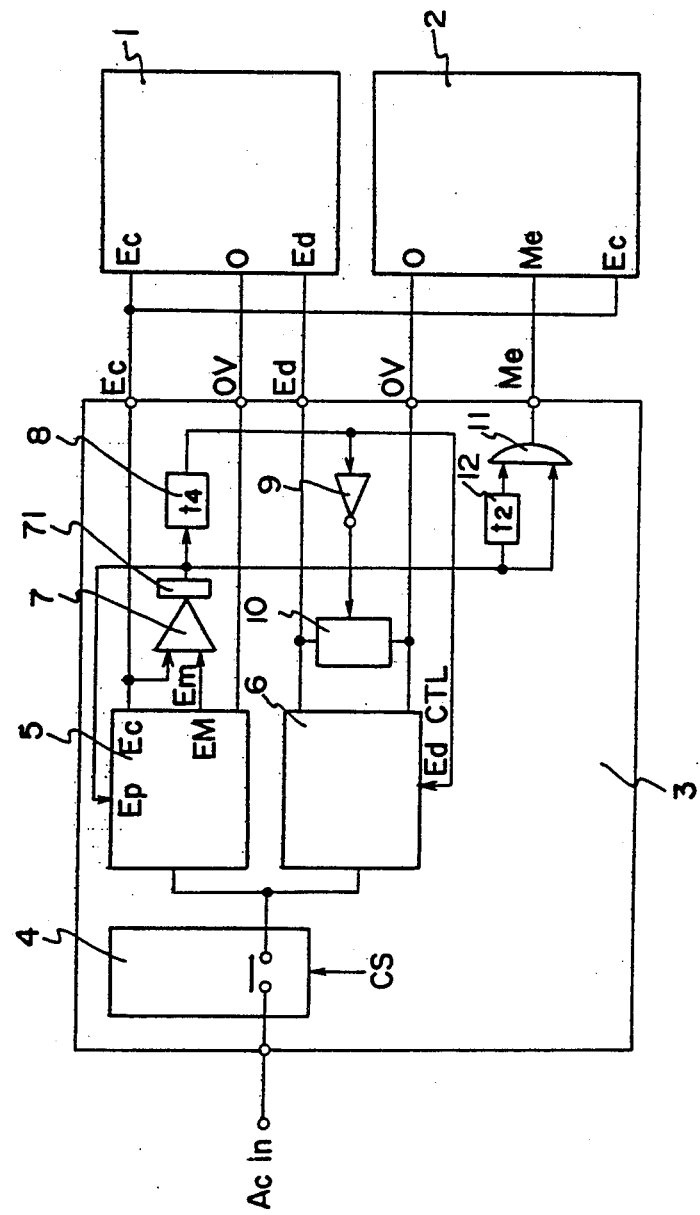
FIG. 3 is a block diagram showing an embodiment of this invention.
Figure 4:
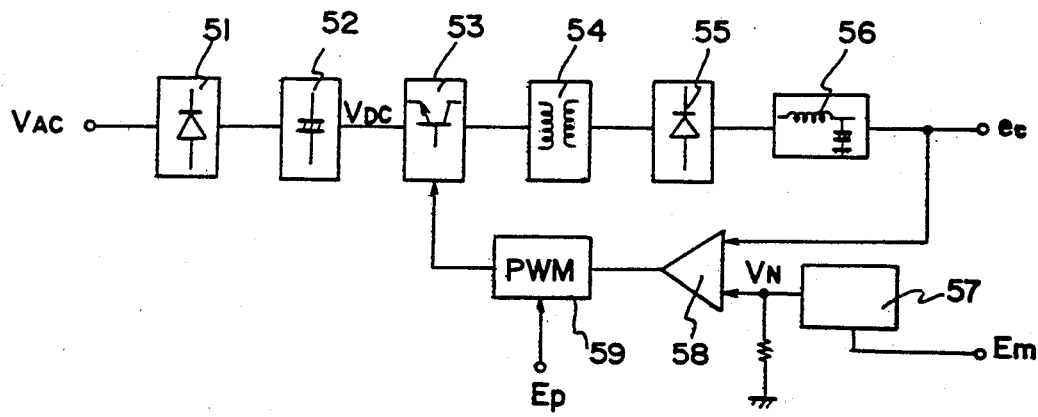
FIG. 4 is a block diagram showing a stabilized D.C. power source circuit which is disposed in the power source device shown in FIG. 3.

FIG. 3 is a detailed block diagram showing an embodiment of this invention. In the figure, parts 1 through 3 are the same as in FIG. 1. In the power source device 3 according to this invention, numeral 4 indicates a power source switch circuit. The power source switch circuit 4 is connected to a commercial power supply. It is turned "on" by a control signal CS which is transmitted from the equipment employing the bubble memory unit, such as a numerical control system and electronic computer, and it is turned "off" when the control signal CS is cut off. Numeral 5 indicates a stabilized D.C. power source circuit. The stabilized D.C. power source circuit 5 is of the switching regulator type based on pulse width modulation, and delivers the supply voltage $E_c$ and a reference voltage $E_m$. Now, the arrangement of the stabilized D.C. power source circuit 5 will be described with reference to FIG. 4. In the figure, numeral 51 designates a rectifier, which is usually constructed by connecting silicon rectifier elements into a bridge. In this embodiment, the commercial A.C. voltage is directly rectified. However, when the commercial supply voltage of a particular country is high or when it is inconvenient to directly connect the power source device 3 and the commercial power supply by the use of a conductor, a transformer may be interposed between the commercial power supply and the rectifier 51. Numeral 52 indicates a smoothing capacitor, numeral 53 a switching element such as a transistor, numeral 54 a transformer, numeral 55 a rectifier similar to the rectifier 51, and numeral 56 a low-pass filter which consists of a choke coil and a capacitor. Shown at 57 is a reference voltage source which serves to deliver the reference voltage $E_m$ and which also delivers a voltage $V_N$ that is applied to an error amplifier 58 to be described later. The reference voltage source 57 has charge storing means such as a capacitor of large capacitance, so that even when the commercial power supply is interrupted, the source 57 can continue to provide the correct reference voltage $E_m$ and correct voltage $V_N$ as predetermined for at least scores of milliseconds owing to the discharge of the charge storing means. One input terminal of error amplifier 58 is supplied with the output of the low-pass filter 56, and has the other input terminal is supplied with the voltage $V_N$. Shown at 59 is a pulse width modulation circuit. The pulse width modulation circuit 59 is provided with a dead time setting terminal $E_p$. When a signal "1" is applied to the dead time setting terminal $E_p$, a signal pulse train whose duty is subjected to pulse width modulation up to at most 30% is delivered. On the other hand, when a signal "0" is applied, a signal pulse train whose duty is subjected to pulse width modulation up to at most 45% is delivered.

Now, the operation of the stabilized D.C. power source circuit 5 will be briefly described. The alternating current applied through the power source switch circuit 4 is rectified by the rectifier 51 into direct current. The D.C. voltage as smoothed by the smoothing capacitor 52 is chopped by the switching element 53, which is controlled by the control pulses generated by the pulse width modulation circuit 59. The chopped voltage is turned by the transformer 54 into an A.C. voltage, which is rectified and delivered to the low-pass filter 56. Thus, a D.C. voltage to be used as the supply voltage $E_c$ is delivered from an output terminal. The error amplifier 58 compares this output voltage with the reference voltage $V_N$. If the output voltage is lower than the reference voltage $V_N$, the error amplifier 58 increases the width of the signal pulses to be provided from the pulse width modulation circuit 59, so as to bring the output voltage into agreement with the reference voltage $V_N$. In the converse case, it decreases the width of the signal pulses so as to bring the output voltage into agreement with the reference voltage $V_N$.

Referring back to FIG. 3, numeral 6 is a stabilized D.C. power source circuit for the supply voltage $E_d$. The stabilized D.C. power source circuit 6 includes a rectifier circuit therein. It is so constructed that an applied alternating current is rectified by the rectifier circuit into direct current and that the output voltage can be increased or decreased by the use of a control element which is made of a power transistor. It is internally provided with a circuit for comparing the output voltage with a reference voltage. In the case where the output voltage tends to become higher than the reference voltage, the resistance component of the control element is increased, and in the case where the output voltage tends to become lower than the reference value, the resistance component of the control element is decreased, whereby the output voltage can follow the reference voltage at all times. When an enable signal $E_d$ CTL is "1", the supply voltage $E_d$ for the bubble memory part 1 is delivered, and when it is of "0", the supply voltage $E_d$ is not delivered. Shown at 7 is a comparator which compares the reference voltage $E_m$ and the supply voltage $E_c$ which are provided from the stabilized D.C. power source circuit 5. A latch circuit 71 latches the signal which is delivered from the comparator 7. When the output of the comparator 7, having been "0" at the closure of the power supply, has become "1", the latch circuit 71 latches and provides the output "1". As soon as the output of the comparator 7 has thereafter become "0", it latches the output "0". Even should the output of the comparator 7 thereafter become "1", it continues to latch "0". Numeral 8 indicates a delay circuit, the delay time of which is several milliseconds. Numeral 9 indicates an inverter, and numeral 10 a rapid discharge circuit which is usually constructed of a thyristor. Numeral 11 indicates an AND circuit, and numeral 12 a delay circuit.

Now, the operation of the circuit arrangement shown in FIG. 3 will be described.

Figure 5:
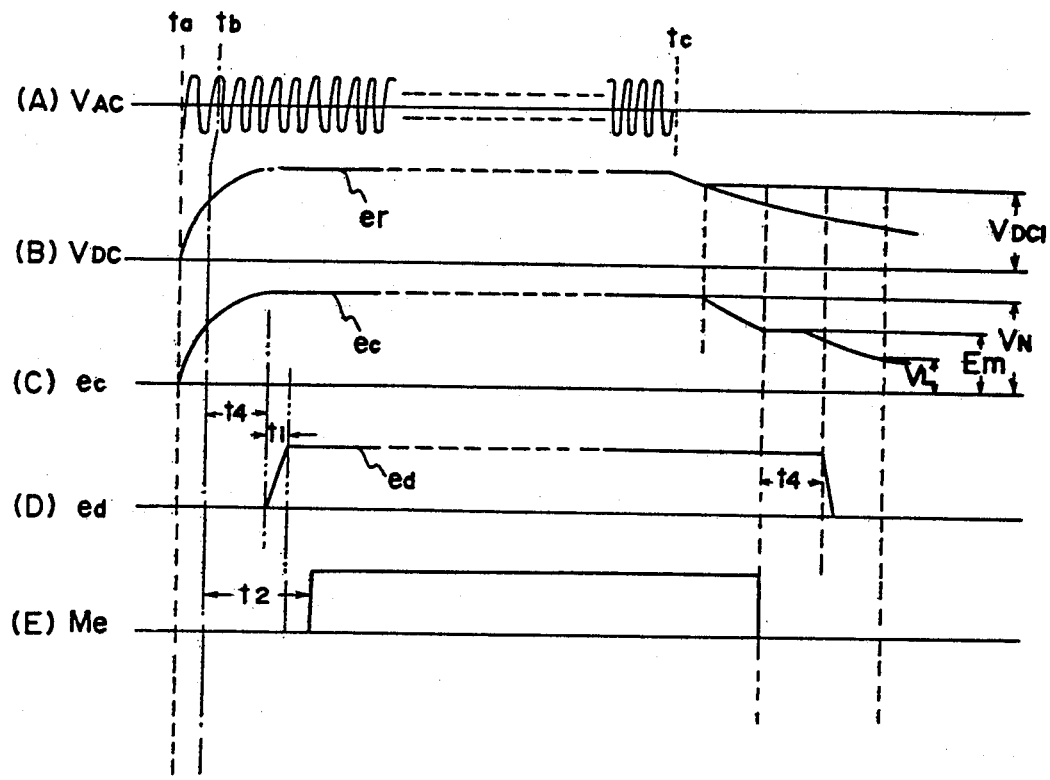
FIG. 5, consisting of A-E is a waveform diagram showing voltage waveforms at various positions of the embodiment of this invention.

When, by way of example, a power source switch of the system NC is closed at a time $t_a$ as indicated in FIG. 5 in order to actuate the numerical control system, the control signal CS from the system NC becomes high and closes the power source switch circuit 4. Upon the closure of the power source switch circuit 4, an A.C. voltage as shown in (a) of FIG. 5 is applied to the stabilized D.C. power source circuit 5 for the supply voltage $E_c$ and the stabilized D.C. power source circuit 6 for the supply voltage $E_d$. The A.C. voltage is rectified in the two circuits 5 and 6. The reference voltage $E_m$ shown in (c) of FIG. 5 is immediately delivered from the terminal $E_M$ of the stabilized D.C. power source circuit 5. Simultaneously therewith, a voltage is generated at the terminal $E_c$. This output voltage rises gradually as shown in (c) of FIG. 5. In the comparator 7, the voltage $e_c$ and the reference voltage $E_m$ are compared. When the voltage $e_c$ is less than the reference voltage $E_m$, the output of the comparator 7 is "0". Accordingly, the enable signal $E_d$ CTL of the stabilized D.C. power source circuit 6 for the supply voltage $E_d$ is "0", and no voltage is provided from the circuit 6. When the voltage $e_c$ has gradually risen to exceed the reference voltage $E_m$ at a time $t_b$, the output of the comparator 7 becomes "1", and the latch circuit 71 immediately latches it and provides "1". When a period of time $t_4$ has subsequently lapsed, the output of the delay circuit 8 becomes "1". Therefore, the output of the inverter 9 becomes "0", and the rapid discharge circuit 10 holds its disabled state. When the output of the delay circuit 8 has become "1", the stabilized D.C. power source circuit 6 for the supply voltage $E_d$ starts its operation because the enable signal $E_d$ CTL is now "1". A voltage $e_d$ corresponding to the supply voltage $E_d$ rises comparatively fast, and reaches a prescribed value in a period of time $t_1$. Upon lapse of a period of time $t_2$ after the time $t_b$ at which the voltage of the comparator 7 has become "1", the output of the delay circuit 12 becomes "1". Therefore, the output of the AND circuit 11 becomes "1", the memory enable signal $M_e$ becomes "1", and the bubble memory unit becomes usable. As is apparent from FIG. 5, the delay time $t_2$ of the delay circuit 12 is set so as to be $(t_1+t_4)<t_2$.

Now, there will be described a case where the power source switch circuit 4 has been opened or where the A.C. input end has been erroneously disconnected. When the A.C. power supply has been disconnected at a time $t_c$ in FIG. 5, the A.C. supply voltage to the stabilized D.C. power source circuit 5 for the supply voltage $E_c$ and the stabilized D.C. power source circuit 6 for the supply voltage $E_d$ is cut off ((a) of FIG. 5). Therefore, the D.C. output voltages of the rectifier circuits contained in the two circuits 5 and 6 fall gradually. Since capacitors are connected on the output sides of these two circuits, the output voltages do not fall rapidly. Part (b) of FIG. 5 shows the output voltage $e_r$ of the rectifier 51 of the stabilized D.C. power source circuit 5 for the supply voltage $E_c$. When this voltage falls to a value $V_{DC1}$, the charge in the capacitor of the low-pass filter 56 is small, and the output voltage $E_c$ of the stabilized D.C. power source circuit 5 cannot maintain the voltage $V_N$ and begins to fall with the fall of the output voltage of the rectifier 51. When the voltage $E_c$ has become lower than the voltage $E_m$, the output of the comparator 7 becomes "0", and hence, the output of the latch circuit 71 becomes "0". In consequence, one input terminal of the AND circuit 11 becomes "0", and the signal $M_e$ immediately becomes "0". Accordingly, the exchange of information between the interior and exterior of the bubble memory unit is inhibited entirely. When the output of the latch circuit 71 has become "0", the dead time setting terminal $E_p$ of the stabilized D.C. power source circuit 5 for the supply voltage $E_c$ becomes "0". Therefore, the duty of the control pulses is spread to 45%, and the output voltage does not become lower than the voltage $E_m$ for a while due to the increased effects of the control pulse in the direction of bringing the output voltage closer to the voltage $V_N$. However, as the charge stored in the smoothing capacitor 52 in the stabilized D.C. power source circuit 5 for the supply voltage $E_c$ and the capacitor in the low-pass filter 56 becomes small, the output voltage $E_C$ cannot maintain the value $E_m$ in spite of the widening of the control pulse and gradually falls toward the lowest service voltage $V_L$. Meantime, both the supply voltage $E_c$ and the supply voltage $E_d$ are at the lowest operating voltages or above. Therefore, the bubble memory part 1 and the control part 2 operate perfectly, and the information read out from the bubble memory part 1 is written thereinto again to complete the refresh operation. On the other hand, upon lapse of the period of time $t_4$, or several milliseconds after the time when the output of the latch circuit 71 has changed-over from "1" to "0", the output of the delay circuit 8 becomes "0". Accordingly, the enable signal $E_d$ CTL becomes "0", so that the stabilized D.C. power source circuit 6 for the supply voltage $E_d$ falls into its inoperative state. Simultaneously, the rapid discharge circuit 10 falls into its conductive state to short-circuit its output ends, and the supply voltage $E_d$ rapidly becomes "0". The output voltage $e_c$ of the stabilized D.C. power source circuit 5 for the supply voltage $E_c$ still continues to fall gradually. In a short time after the lapse of the period of time $t_4$, the voltage becomes lower than the allowable lower-limit voltage $V_L$.

In the above embodiment, if an overvoltage protection circuit called the clover circuit is disposed within the stabilized D.C. power source circuit 6 for the supply voltage $E_d$, it can also be used as the rapid discharge circuit 10.

As described above in detail, according to this invention, the power source circuit for the control circuit is constructed on the basis of a pulse width modulation system, and upon interruption of the A.C. input voltage, the duty cycle can be set to an upper limit greater than that during ordinary use, so that the period of time in which the control voltage reaches the allowable lower-limit voltage after the interruption of the A.C. input voltage can be made longer than in the prior art. Accordingly, even when the A.C. input voltage is unexpectedly interrupted due to service interruptions or the like in the course of reading information stored in the bubble memory, the refresh operation can be perfectly conducted.

What we claim is:

1. In an improved power source device for a bubble memory unit having a bubble memory part and a control part, the power source device being of the type which uses A.C. power and which produces a supply voltage for controlling the bubble memory part and the control part, a supply voltage for driving the bubble memory part, and a memory enable signal to be applied to the control part, the improvement comprising: the supply voltage for controlling the bubble memory part and the control part is produced by a stabilized D.C. power source circuit which employs a switching regulator means for regulating the output of the D.C. power source circuit by using pulse width modulated chopping pulses which have an upper-limit pulse width value during ordinary voltage control when the A.C. power is "on," and which is provided with means for expanding the chopping pulse width in excess of its upperlimit value during ordinary voltage control when the output voltage value of said supply voltage for controlling the bubble memory and control parts has become lower than a predetermined value, so that the pulse width is made greater than in the ordinary voltage control, permitting said bubble memory unit to be reliably refreshed when the A.C. power is turned "off".

2. A power source device for a bubble memory unit as defined in claim 1, wherein the means for expanding the chopping pulse comprises a comparator which detects a falling of said controlling supply voltage, said comparator being disposed on the output side of said stabilized D.C. power source circuit, the output of said comparator being used to expand said chopping pulse width in excess of said upper-limit value during said ordinary voltage control.

3. In an improved power source device for a bubble memory unit having a bubble memory part and a control part, the power source device being of the type which uses A.C. power and which produces a supply voltage for controlling the bubble memory part and the control part, a supply voltage for driving the bubble memory part, and a memory enable signal to be applied to the control part, the improvement comprising: the supply voltage for controlling the bubble memory part and the control part is produced by a stabilized D.C. power source circuit which employs a switching regulator means for regulating the output of the D.C. power source circuit by using pulse width modulated chopping pulses which have an upper-limit pulse width valve during ordinary voltage control when the A.C. power is "on," and which is provided with means for expanding the chopping pulse width in excess of its upperlimit value during ordinary voltage control when said output voltage value of said supply voltage for controlling the bubble memory and control parts has become lower than a predetermined value, so that the pulse width is made greater than in the ordinary voltage control, and delay circuit means responsive to the means for expanding the chopping pulse width for turning the supply voltage for driving the bubble memory part "off" a predetermined period of time after the supply voltage for controlling the bubble memory and control parts has fallen to said predetermined value.

4. A power source device for a bubble memory unit as defined in claim 3, further comprising rapid discharge circuit means for short-circuiting the supply voltage for driving the bubble memory part, said rapid discharge circuit means being responsive to said delay circuit means.

5. A power source device, comprising: first means for receiving A.C. power and producing a first D.C. output, said first means including switching regulator means for regulating the first output by using a pulse width regulated train of pulses having a maximum pulse width when the A.C. power is being received; and means for increasing the maximum pulse width after the A.C. power has ceased to be received and the first D.C. output has fallen to a predetermined value.

6. The power source of claim 5, further comprising second means for receiving A.C. power and producing a second D.C. output; and means responsive to said means for increasing the maximum pulse width for deactivating the second means a predetermined period of time after said first D.C. output has fallen to said predetermined value.

7. The power source of claim 6, wherein the means for increasing the maximum pulse width comprises comparator means for comparing the first D.C. output to a reference voltage having the predetermined level, and a latch circuit having an input connected to the output of the comparator means and an output connected to the first means; and wherein the means for deactivating the second means comprises a delay circuit connected to the output of the latch circuit.

8. The power source device of claim 7, further comprising a gate having a first input connected to the output of said latch circuit and a second input connected to the latch circuit via a delay circuit.

* * * * *

UNITED STATES PATENT AND TRADEMARK OFFICE
CERTIFICATE OF CORRECTION

PATENT NO. : 4,451,902
DATED : May 29, 1984
INVENTOR(S) : Imazeki et al

It is certified that error appears in the above-identified patent and that said Letters Patent is hereby corrected as shown below:

Front page, at line 8 of the Abstract, delete "the".

Column 1, line 40, "$E_c$" (second occurrence) should be --$E_d$--.

Column 2, line 35, delete ",".

Column 3, line 47, delete "has".

Column 6, line 54, "upperlimit" should be --upper-limit--.

Column 7, line 19, "upperlimit" should be --upper-limit--.

Signed and Sealed this

Eleventh Day of December 1984

[SEAL]

Attest:

GERALD J. MOSSINGHOFF

*Attesting Officer*     *Commissioner of Patents and Trademarks*